US010963057B2

(12) United States Patent
Choi

(10) Patent No.: US 10,963,057 B2
(45) Date of Patent: Mar. 30, 2021

(54) HAPTIC FEEDBACK BUTTON

(71) Applicant: CHUNGANG UNIVERSITY INDUSTRY-ACADEMIC COOPERATION FOUNDATION, Seoul (KR)

(72) Inventor: Seung Tae Choi, Seoul (KR)

(73) Assignee: CHUNGANG UNIVERSITY INDUSTRY-ACADEMIC COOPERATION FOUNDATION, Seoul (KR)

(*) Notice: Subject to any disclaimer, the term of this patent is extended or adjusted under 35 U.S.C. 154(b) by 0 days.

(21) Appl. No.: 16/485,643

(22) PCT Filed: Jan. 26, 2018

(86) PCT No.: PCT/KR2018/001179
§ 371 (c)(1),
(2) Date: Aug. 13, 2019

(87) PCT Pub. No.: WO2018/151440
PCT Pub. Date: Aug. 23, 2018

(65) Prior Publication Data
US 2019/0361531 A1 Nov. 28, 2019

(30) Foreign Application Priority Data
Feb. 14, 2017 (KR) .................. 10-2017-0019921

(51) Int. Cl.
G06F 3/01 (2006.01)
G06F 3/02 (2006.01)
(Continued)

(52) U.S. Cl.
CPC ............... *G06F 3/016* (2013.01); *G06F 3/02* (2013.01); *G06F 3/044* (2013.01); *H01L 41/047* (2013.01);
(Continued)

(58) Field of Classification Search
CPC .............................. G06F 3/016; G06F 3/0414
See application file for complete search history.

(56) References Cited

U.S. PATENT DOCUMENTS

2009/0322496 A1 12/2009 Da Coata
2013/0088448 A1* 4/2013 Seo ...................... G06F 3/0488
345/173

(Continued)

FOREIGN PATENT DOCUMENTS

JP 2016-129015 A 7/2016
KR 10-2010-0065816 A 6/2010
(Continued)

*Primary Examiner* — Kevin M Nguyen
(74) *Attorney, Agent, or Firm* — Novick, Kim & Lee, PLLC; Jae Yoon Kim

(57) ABSTRACT

Provided is a haptic feedback button, which includes: a substrate; a lower electrode provided on an upper portion of the substrate, and formed by patterning a ground electrode and a touch sensing electrode; an upper electrode, provided above the lower electrode with an interval from the lower electrode, to which a driving voltage is applied; and a cover provided on an upper portion of the upper electrode, wherein a piezoelectric polymer is provided on an upper portion of the lower electrode or a lower portion of the upper electrode so that fretting vibration may be generated when the piezoelectric polymer is in close contact with the lower electrode or the upper electrode that are disposed to face each other.

14 Claims, 8 Drawing Sheets

(51) Int. Cl.
*G06F 3/044* (2006.01)
*H01L 41/047* (2006.01)
*H01L 41/053* (2006.01)
*H01L 41/09* (2006.01)
*H01L 41/193* (2006.01)

(52) U.S. Cl.
CPC ............ *H01L 41/053* (2013.01); *H01L 41/09* (2013.01); *H01L 41/193* (2013.01)

(56) References Cited

U.S. PATENT DOCUMENTS

| | | | |
|---|---|---|---|
| 2016/0033343 A1* | 2/2016 | Park | G01L 1/146 |
| | | | 73/862.046 |
| 2016/0291729 A1* | 10/2016 | Schardt | H01L 41/22 |
| 2017/0357325 A1* | 12/2017 | Yang | G06F 3/0414 |

FOREIGN PATENT DOCUMENTS

| | | |
|---|---|---|
| KR | 10-2014-0109002 A | 9/2014 |
| KR | 10-2015-0043138 A | 4/2015 |

* cited by examiner

HAPTIC FEEDBACK BUTTON

TECHNICAL FIELD

The present invention relates to a haptic feedback button, and more particularly, to a haptic feedback button which is capable of implementing a haptic feedback function by applying a piezoelectric polymer material to a touch screen.

BACKGROUND ART

In consideration of general stimulus recognition of a human, when two or more senses, such as a visual sense, an auditory sense, and a tactile sense, are provided in a composite form, users can interact more naturally with electronic devices. Recently, portable electronic devices, industrial devices, medical devices, automobiles, game consoles, virtual realities, and the like provide a sense of touch as well as visual and audio recognition to users, thereby greatly contributing to providing realistic user experiences (UXs).

Feedback to visual and auditory senses is relatively easy to implement, but feedback to a tactile sense is not easy to implement. Currently, in portable electronic devices such as smart phones, gross vibration methods employing eccentric motors, linear resonance actuators, and piezoelectric ceramic actuators are mainly used. However, in the case of a portable electronic device with a touch screen having a large size such as a smart pad, the gross vibration method is very inefficient such as to gradually become difficult to use.

Further, in order to safely perform various convenient operations, future intelligent vehicles need to secure stable user interface (UI) technology which is capable of providing visual and auditory information as well as tactile information.

DISCLOSURE

Technical Problem

The present invention is directed to providing a haptic feedback button which allows a user to sense haptic feedback at the same time that the user touches the haptic feedback button using a piezoelectric polymer material.

Technical Solution

One aspect of the present invention provides a haptic feedback button including a substrate, a lower electrode provided on the substrate and formed by patterning a ground electrode and a touch sensing electrode, an upper electrode which is provided above the lower electrode and spaced an interval from the lower electrode and to which a driving voltage is applied, and a cover provided on the upper electrode, wherein a piezoelectric polymer is provided on the lower electrode or below the upper electrode, and, when the piezoelectric polymer is pressed against the lower electrode or the upper electrode disposed to face the lower electrode, a fretting vibration is generated.

A support spacer may be provided between edge portions of the lower electrode and the upper electrode to form a gap.

Each of the upper electrode, the cover, and the support spacer may be made of a transparent material.

Each of the cover and the upper electrode may be made of a flexible material.

At least a part of the cover may be made of a stiff material.

A central spacer may be provided between the substrate and the lower electrode such that a central portion of the lower electrode may be formed to be bent upward.

An edge portion of the cover and the edge portion of the upper electrode may be formed to be bent upward.

The edge portion of the upper electrode may be formed to be bent upward.

A hinge groove may be formed in the edge portion of the cover such that a thickness of the edge portion of the cover may be relatively small.

A support layer may be provided below the lower electrode, an elastic coefficient and a thickness of the support layer may be designed to form a resonance in a frequency ranging from 100 to 250 Hz.

The cover may include a stiff portion made of a stiff material and a flexible portion provided on the stiff portion and made of a flexible material, wherein an edge portion of the stiff portion may be formed to be incised.

The incised edge portion of the stiff portion may be filled with the flexible portion.

The cover may include a flexible portion made of a flexible material and formed only on an edge portion of the cover, and a stiff portion provided on the flexible portion and made of a stiff material.

The ground electrode may be patterned in a central portion of the haptic feedback button, and the touch sensing electrode may be patterned to surround a periphery of the ground electrode.

The piezoelectric polymer may be a polyvinylidene fluoride (PVDF)-based ferroelectric polymer or a relaxor ferroelectric polymer.

The PVDF-based ferroelectric polymer may be Poly (vinylidene fluoride-trifluoroethylene (P(VDF-TrFE)), and the relaxor ferroelectric polymer may be Poly (vinylidene fluoride-trifluoroethylene-chlorofluoroethylene (P(VDF-TrFE-CFE)) or Poly (vinylidene fluoride-trifluoroethylene-chlorotrifluoroethylene (P(VDF-TrFE-CTFE)).

Advantageous Effects

In accordance with the embodiments of the present invention, since a touch sensing electrode is disposed on a lower electrode, a fretting vibration is generated through a piezoelectric polymer material at the same time that a user touches the present invention so that the user can immediately sense haptic feedback.

MODES OF THE INVENTION

Figure 1:
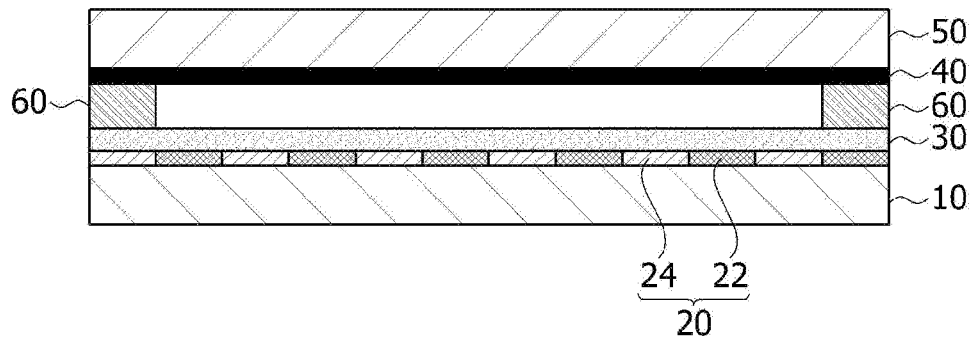
FIG. 1 is a cross-sectional view of a haptic feedback button according to one embodiment of the present invention.

The present invention may be modified into various forms and may have a variety of embodiments, and, therefore, specific embodiments will be illustrated in the accompanying drawings and described in detail. The embodiments, however, are not to be taken in a sense which limits the present invention to the specific embodiments, and should be construed to include modifications, equivalents, or substituents within the spirit and technical scope of the present invention. Also, in the following description of the present invention, when a detailed description of a known related art is determined to obscure the gist of the present invention, the detailed description thereof will be omitted.

Although the terms "first," "second," and the like may be used herein to describe various components, these components should not be limited to the terms. The terms are used only for the purpose of distinguishing one component from another component.

Terms used herein are used only for the purpose of describing the specific embodiments, and are not intended to limit the present invention. Unless the context clearly dictates otherwise, the singular form includes the plural form. It should be understood that the terms "comprise," "include," and "have" specify the presence of stated herein features, numbers, steps, operations, components, elements, or combinations thereof, but do not preclude the presence or possibility of adding one or more other features, numbers, steps, operations, components, elements, or combinations thereof.

Hereinafter, embodiments of a haptic feedback button according to the present invention will be described in detail with reference to the accompanying drawings. In the following description with reference to the accompanying drawings, the same or corresponding components are assigned with the same reference numerals, and a duplicate description thereof will be omitted.

Figure 2:
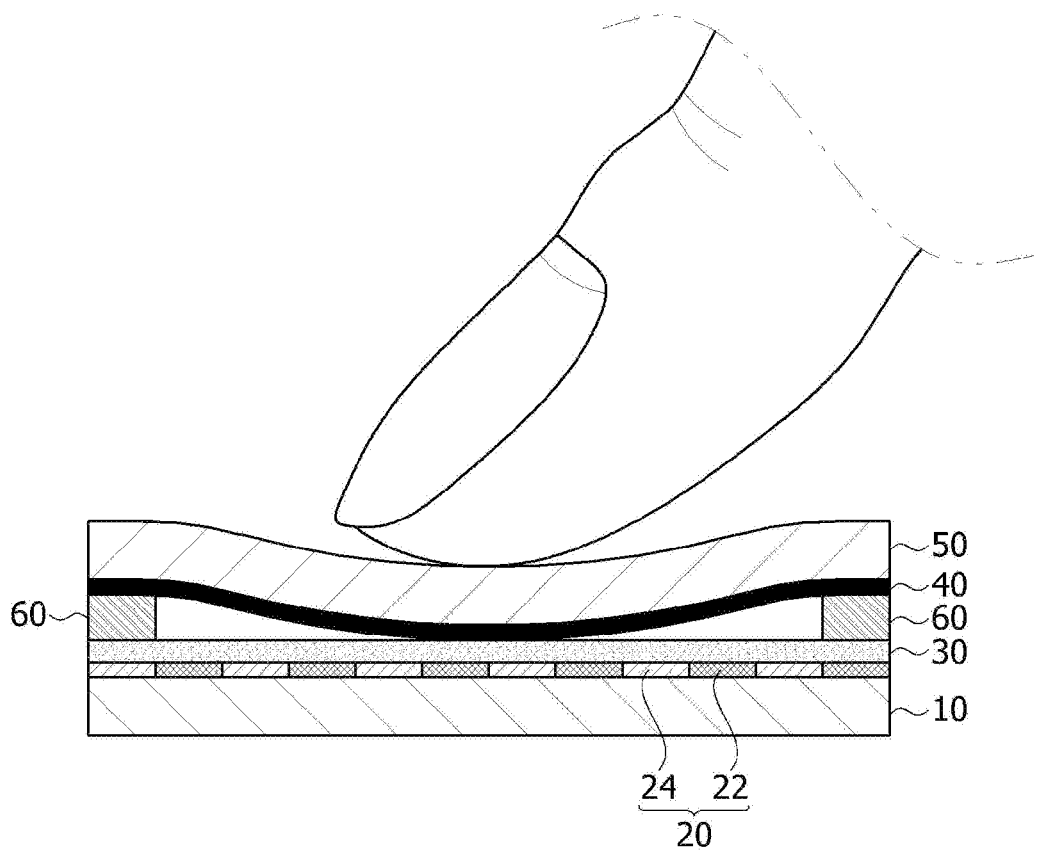
FIG. 2 is a diagram illustrating a driving example of FIG. 1.

FIG. 1 is a cross-sectional view of a haptic feedback button according to one embodiment of the present invention, and FIG. 2 is a diagram illustrating a driving example of FIG. 1.

As shown in the drawings, the haptic feedback button according to the present invention may include a substrate 10, a lower electrode 20 provided on the substrate 10 and formed by patterning a ground electrode 22 and a touch sensing electrode 24, an upper electrode 40 which is provided above the lower electrode 20 and spaced an interval therefrom and to which a driving voltage is applied, and a cover 50 provided on the upper electrode 40. Further, a piezoelectric polymer 30 is provided on the lower electrode 20. When the piezoelectric polymer 30 is pressed against the upper electrode 40 which is disposed to face the piezoelectric polymer 30, a fretting vibration may be generated.

The substrate 10 is a base substrate disposed below the lower electrode 20 and corresponds to a base material of the haptic feedback button. The substrate 10 may be made of a transparent polymer film such as glass, polyether sulfone (PES), polyether sulfone (PET), polyetheretherketone (PEEK), polycarbonate, or the like.

The lower electrode 20 and the upper electrode 40 are electrodes for driving the piezoelectric polymer 30, are disposed above and below the piezoelectric polymer 30, and are each formed of a transparent material. The lower electrode 20 and the upper electrode 40 may each be formed of a transparent conductive oxide (TCO) such as indium tin oxide (ITO) or indium zinc oxide (IZO). In addition to the TCO, the lower electrode 20 and the upper electrode 40 may each be formed of a conductive polymer electrode including (Poly(3,4-ethylenedioxythiophene):poly(styrenesulfonate)).

Figure 3:
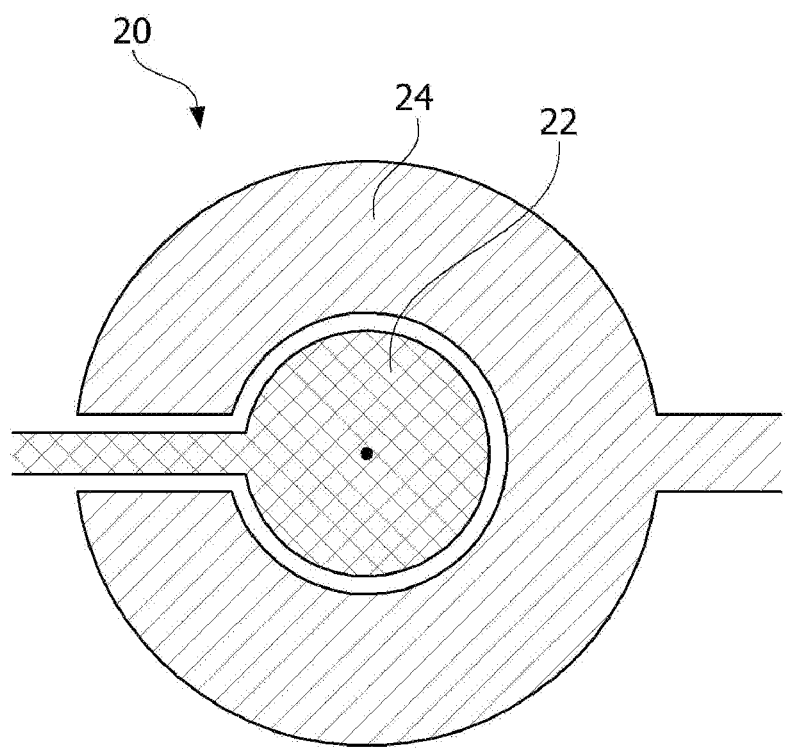
FIGS. 3 and 4 diagrams illustrating examples of a ground electrode and a touch sensing electrode which constitute a lower electrode.
Figure 4:
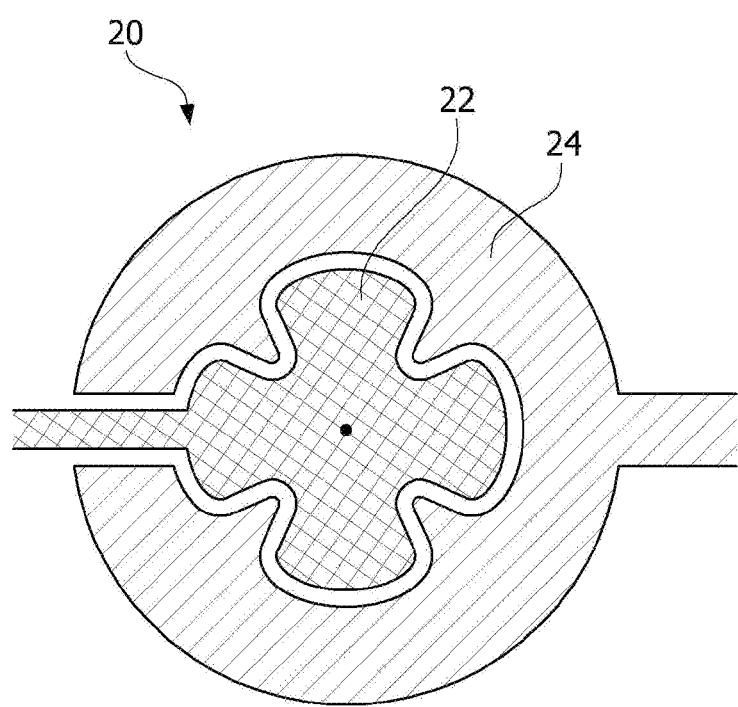

FIGS. 3 and 4 diagrams illustrating examples of the ground electrode and the touch sensing electrode which constitute the lower electrode.

Referring to the drawings, in the present embodiment, the lower electrode 20 includes the ground electrode 22 and the touch sensing electrode 24. That is, since the touch sensing electrode 24 is provided in the lower electrode 20, when a user touches the present invention with his or her finger, a touch is recognized only in a case in which a contact should be made to the lower electrode 20. The touch sensing electrode 24 which serves as a touch sensor may be formed to be patterned with the ground electrode 22.

A capacitive touch sensor detects a touch position by recognizing a portion at which a current amount is varied using capacitance of a human body. When the capacitive touch sensor is disposed on the upper electrode 40, there is a problem in that, when a user touches the upper electrode 40, the user cannot simultaneously feel a haptic feedback function which will be implemented in the present embodiment.

In other words, a fretting vibration for the haptic feedback function is generated when the piezoelectric polymer 30 is brought into contact with the upper electrode 40 or the lower electrode 20. When the upper electrode 40 is touched, the piezoelectric polymer 30 is not brought into contact with the upper electrode 40 or the lower electrode 20 so that it is necessary for the user to further press the upper electrode 40 so as to feel haptic feedback due to the fretting vibration. That is, a slight delay occurs between the touch sensing and the haptic feedback such that the user feels as if the haptic feedback does not simultaneously occur with the touch sensing.

In order to solve the problem, in the present embodiment, the lower electrode 20 is patterned to form the ground electrode 22 and the touch sensing electrode 24 such that a touch sensing is performed on the lower electrode 20. Therefore, as shown in FIG. 2, the user should press the cover 50 until the upper electrode 40 is pressed against the piezoelectric polymer 30 such that the fretting vibration is generated and, simultaneously, the touch sensing is performed. As described above, when the touch sensing and the haptic feedback are simultaneously performed, the user feels that the haptic feedback is immediately performed when touching such that touch sensitivity may be improved and the haptic feedback function may be maximized.

Referring to the drawings, the ground electrode 22 may be disposed at a center of the lower electrode 20, and the touch sensing electrode 24 may be disposed to surround a periphery of the ground electrode 22. The reason for patterning the lower electrode 20 is that when the driving voltage is applied from the upper electrode 40, the ground electrode 22 forms a high voltage electrode, and the touch sensing electrode 24 disposed around the ground electrode 22 allows the touch sensing to be effective using a variance in capacitance. The ground electrode 22 may be patterned in various shapes such as a circular shape in FIG. 3 and a clover shape in FIG. 4, and the touch sensing electrode 24 may be patterned to surround the periphery of the ground electrode 22.

The patterning shown in the drawings is merely an example, and the ground electrode 22 and the touch sensing electrode 24 may be formed with various types of patterning applied to a conventional capacitive touch sensor.

In the present embodiment, the upper electrode 40 serves as a drive electrode to which a driving voltage is applied. As shown in FIG. 2, in a state in which the driving voltage is applied, when the cover 50 is deformed and the upper electrode 40 is pressed against the piezoelectric polymer 30, the touch sensing electrode 24 senses a touch and, simultaneously, an electric field is locally increased at the contact portion and thus the piezoelectric polymer 30 is deformed such that the fretting vibration is generated.

The piezoelectric polymer 30 is provided on the lower electrode 40 and has a predetermined gap with the upper electrode 20. The piezoelectric polymer 30 may employ a PVDF-based ferroelectric polymer (e.g., P(VDF-TrFE)) or a relaxor ferroelectric polymer (e.g., P(VDF-TrFE-CFE) or P(VDF-TrFE-CTFE)).

For reference. P(VDF-TrFE) is composed of a combination of two monomolecular VDF and TrFE among PVDF-based polymers and is known as one among widely used piezoelectric polymers because of exhibiting a piezoelectric characteristic that is higher than piezoelectric characteristics of other piezoelectric polymers.

P(VDF-TrFE-CFE) or P(VDF-TrFE-CTFE), which is a relaxor ferroelectric polymer, is known as a very promising material that generates a strain at a maximum level from 5 to 7% under an electric field of about 150 V/m.

The cover 50 is disposed on the upper electrode 40 to serve as a cover of the haptic feedback button. The cover 50 is a portion in actual contact with a finger of the user and the like and may be made of a transparent polymer film that is the same as that of the substrate 10.

Support spacers 60 may be provided between edge portions of the lower electrode 20 and the upper electrode 40 to form a gap. The support spacers 60 may be provided entirely or intermittently along an edge of the haptic feedback button.

All of the substrate 10, the lower electrode 20, the piezoelectric polymer 30, the upper electrode 40, the cover 50, and the support spacer 60, which are described above, may be made of a transparent material. This is to allow light, which is transmitted from a display device disposed below the substrate 10, to be transmitted to an upper portion well. In particular, when the support spacers 60 are each made of a transparent material which is capable of transmitting light, the light transmitted from the display device, which is disposed below the substrate 10, is transmitted to the outside through the support spacers 60 such that the user may easily recognize a shape of the haptic feedback button. Alternatively, all of the above configurations may each be made of a flexible material. As described above, when all of the above configurations are made of a flexible material, it is possible to implement a flexible haptic feedback button which is entirely bendable.

Figure 5:
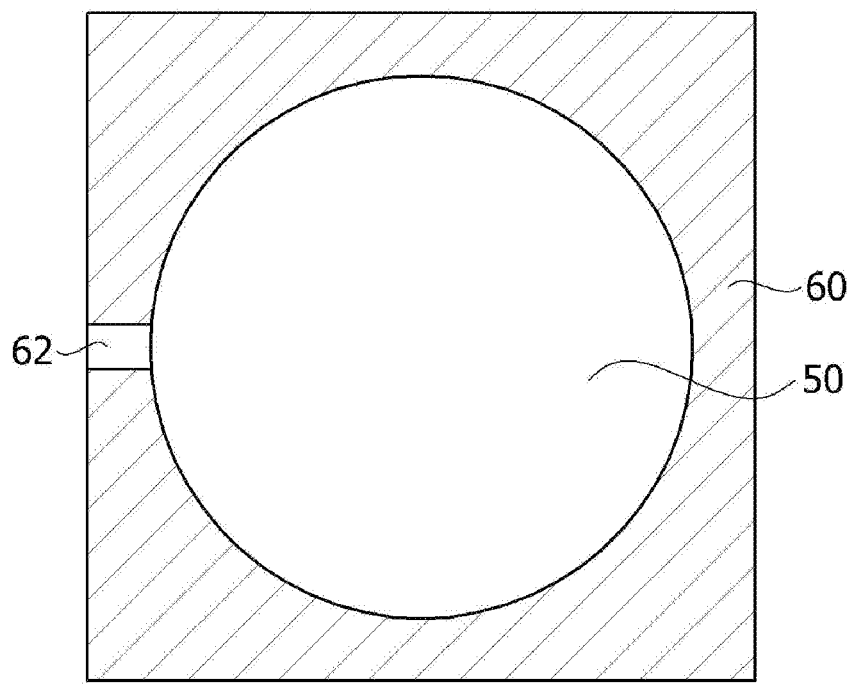
FIG. 5 is a diagram illustrating an air channel formed in a support spacer.

Referring to FIG. 5, an air channel 62 may be formed in one side of the support spacer 60 so as to discharge air between the lower electrode 20 and the upper electrode 40 to the outside when pressure is applied to the cover 50.

Figure 6:
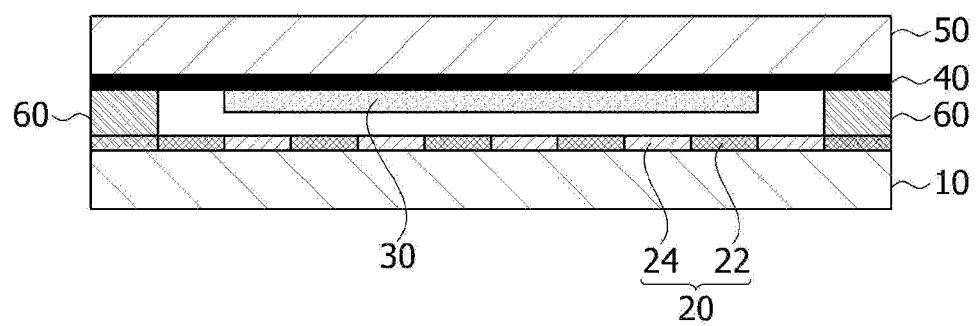
FIG. 6 is a cross-sectional view of a haptic feedback button according to another embodiment of the present invention.

Meanwhile, a haptic feedback button according to another embodiment of the present invention will be described below with reference to FIG. 6. FIG. 6 is a cross-sectional view of a haptic feedback button according to another embodiment of the present invention.

As shown in the drawing, the present embodiment has a configuration which is substantially the same as that of the above-described embodiment. However, in the present embodiment, a piezoelectric polymer 30 is not provided on a lower electrode 20 but is provided below an upper electrode 40. That is, the piezoelectric polymer 30 is not provided on the lower electrode 20 but is provided on the upper electrode 40.

The piezoelectric polymer 30 is disposed between two opposing electrodes. When the two opposing electrodes are in contact with each other and thus electrical energy is applied, the piezoelectric polymer 30 generates a fretting vibration to implement haptic feedback. Therefore, the piezoelectric polymer 30 may generate a mechanical vibration in a state in which the upper electrode 40 is pressed against the lower electrode 20 as long as the piezoelectric polymer 30 is provided on either the upper electrode 40 or the lower electrode 20 opposite the upper electrode 40.

The haptic feedback button according to the above-described embodiments may be widely used in and applied to the fields of touch buttons, touch pads, portable display devices, flexible display devices, and optical devices of various electronic devices.

The above-described embodiments are applied to a soft button type. That is, the cover 50 which the user directly touches is made of a flexible material that is directly deformable. In this case, as shown in FIG. 2, when the user touches the cover 50, the cover 50 may be entirely deformed until the upper electrode 40 is pressed against the piezoelectric polymer 30.

Figure 7:
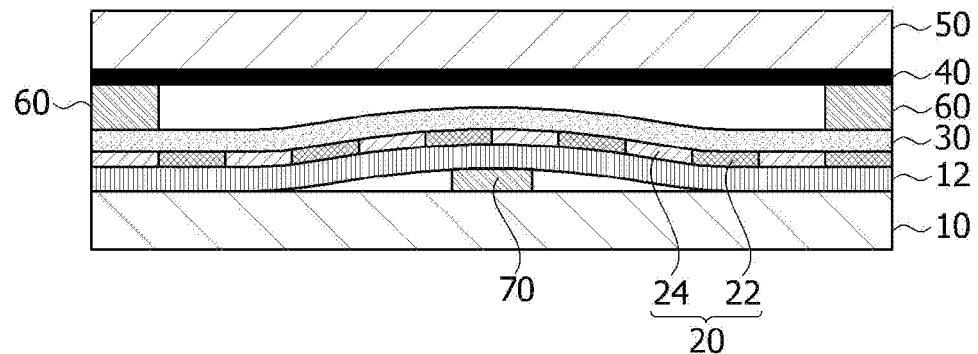
FIG. 7 is a cross-sectional view of a haptic feedback button according to still another embodiment of the present invention.

Meanwhile, a haptic feedback button according to still another embodiment of the present invention will be described below with reference to FIG. 7. FIG. 7 is a cross-sectional view of a haptic feedback button according to still another embodiment of the present invention.

As shown in the drawing, the support layer 12 may be provided below the lower electrode 20. i.e., between the substrate 10 and the lower electrode 20. The support layer 12 is a portion which is bonded below the lower electrode 20 to support the lower electrode 20. When the fretting vibration is generated, an elastic coefficient and a thickness of the support layer 12 may be adjusted to allow the lower electrode 20, the upper electrode 40, the piezoelectric polymer 30, and the support layer 12 to be resonated in a frequency range (100 to 250 Hz) in which the user may best sense a vibration. For example, when a resonant frequency is 200 Hz, the support layer 12 may be designed and manufactured with an elastic coefficient and a thickness that may generate the resonant frequency. In this case, even when a small driving voltage is applied, the small driving voltage may be converted into maximum mechanical energy through resonance such that there is an advantage in that a haptic feedback effect may be maximized. Meanwhile, the support layer 12 may be made of a polymer film such as PET.

A central spacer 70 may be provided between the substrate 10 and the support layer 12. The central spacer 70 is provided at a center of the substrate 10. Since the central spacer 70 is provided, the lower electrode 20 is bent upward as shown in FIG. 7.

In the present embodiment, the reason for providing the central spacer 70 is that, unlike the above-described embodiments, the haptic feedback button according to the present embodiment is applied to a hard button type. That is, in the present embodiment, at least a part of a cover 50 is made of a stiff material having a predetermined stiffness instead of a flexible material. Accordingly, when the cover 50 is touched, in order to allow the upper electrode 40 to be easily pressed against the piezoelectric polymer 30, the central spacer 70 is disposed such that the lower electrode 20 is bent upward. In this case, since a gap between the upper electrode 40 and the piezoelectric polymer 30 is reduced, touching may be made easier.

FIGS. 8 to 13 are diagrams illustrating various modified examples of still another embodiment shown in FIG. 7. These modified examples are examples for allowing the cover 50, which is made of a stiff material, to be pressed well, and a configuration which is capable of serving as a kind of hinge on an edge of the cover 50 is added.

Figure 8:
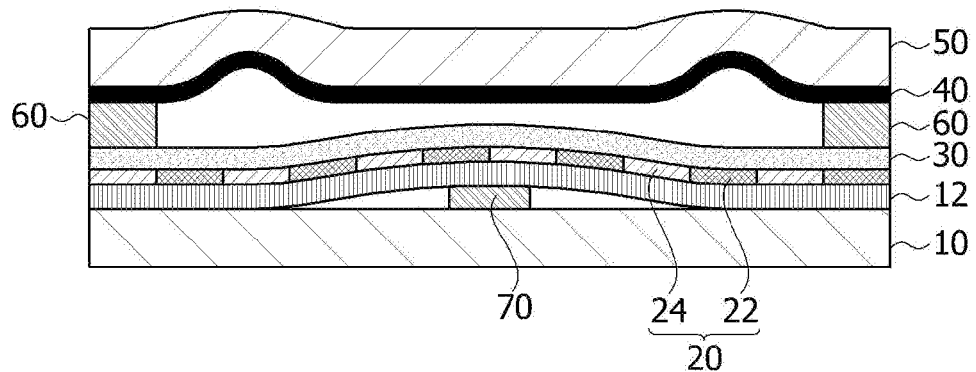
FIGS. 8 to 13 are diagrams illustrating various modified examples of still another embodiment shown in FIG. 7.

Referring to FIG. 8, edge portions of the cover 50 and the upper electrode 40 may be formed to be bent upward. As described above, when the edge portions are formed to be bent, even when the user slightly touches the cover 50, the cover 50 is pressed downward such that touch sensing may be easily performed.

Figure 9:
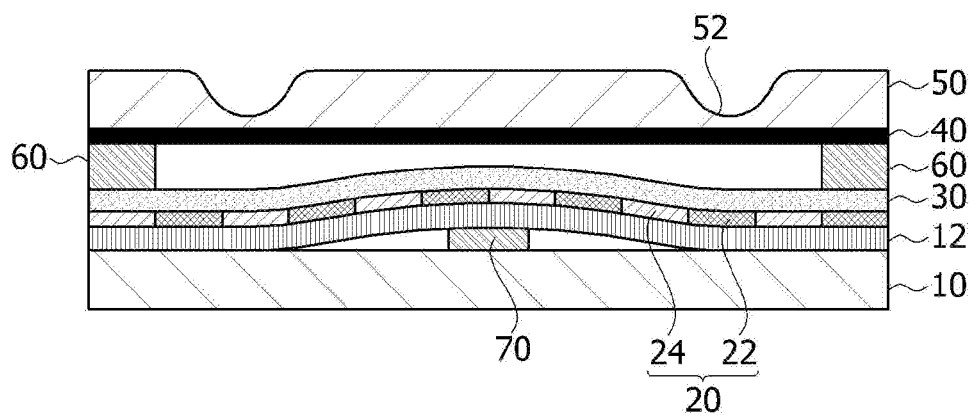
Figure 10:
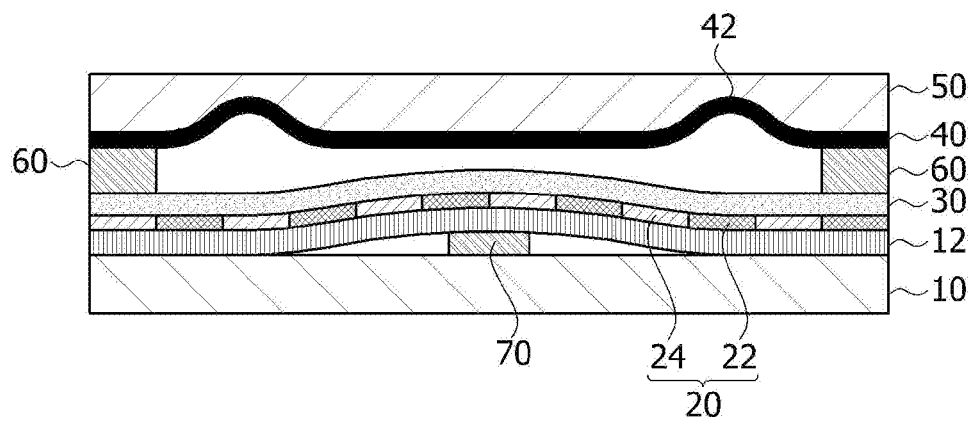

Referring to FIG. 9, a hinge groove 52 is formed in the edge portion of the cover 50. When the hinge groove 52 is formed, a thickness of the edge portion of the cover 50 becomes relatively small such that the cover 50 may be easily pressed downward. Further, referring to FIG. 10, an edge portion 42 of the upper electrode 40 is bent upward such that the thickness of the edge portion of the cover 50 may be relatively small.

Figure 11:
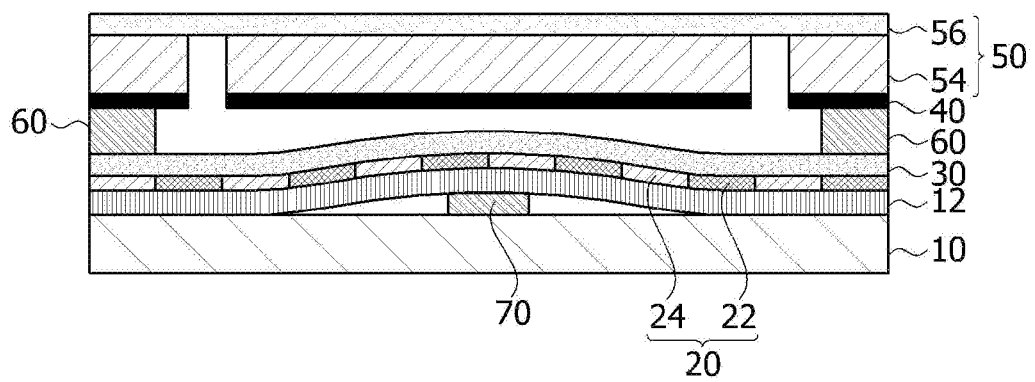
Figure 12:
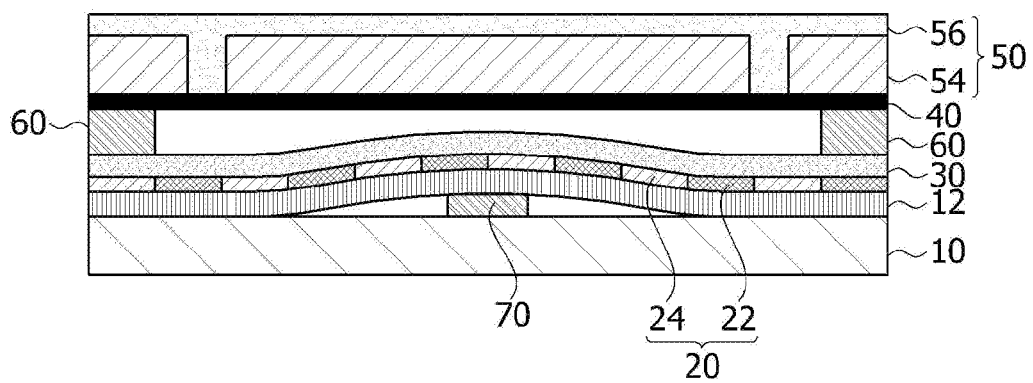
Figure 13:
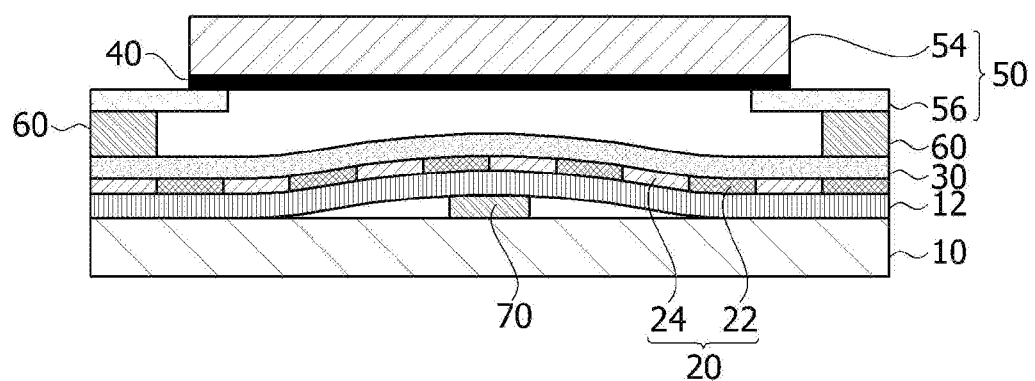

Referring to FIGS. 11 to 13, the cover 50 may include a stiff portion 54 made of a stiff material and a flexible portion 56 made of a flexible material. In FIG. 11, the stiff portion 54 is provided on the upper electrode 40, and the flexible portion 56 is provided on the stiff portion 54. In this case, the edge portion of the stiff portion 54 is incised to configure the edge portion of the flexible portion 56 to be deformed well. Further, in FIG. 12, the incised edge portion of the stiff portion 54 is filled with the flexible portion 56 to configure the edge portion of the flexible portion 56 to be deformed well. Further, in FIG. 13, the flexible portion 56 is provided on the edge portion of the upper electrode 40, and the stiff portion 54 is provided above the flexible portion 56. In this case, when the user presses the stiff portion 54, the edge portion is flexible to be pressed well.

Although the description has been made with reference to the specific embodiments of the present invention, it should be understood that various alternations and modifications of the present invention can be devised by those skilled in the art to which the present invention pertains without departing from the spirit and scope of the present invention, which are defined by the appended claims.

The invention claimed is:

1. A haptic feedback button, comprising:
   a substrate;
   a lower electrode layer disposed on or above the substrate and having a ground electrode and a touch sensing electrode arranged in a pattern;
   an upper electrode layer disposed above the lower electrode layer and spaced apart from the lower electrode layer, wherein the upper electrode layer is configured to receive a driving voltage;
   a cover disposed on the upper electrode layer; and
   a piezoelectric polymer layer disposed on a top surface of the lower electrode layer or on a bottom surface of the upper electrode layer facing the top surface of the lower electrode layer,
   wherein the piezoelectric polymer layer is configured to generate a fretting vibration when the piezoelectric polymer layer is pressed against the upper electrode layer or the lower electrode layer, and
   wherein the ground electrode has a circular shape and is disposed at a center of the lower electrode,
   wherein the touch sensing electrode has a ring shape having an inner circular space corresponding to the circular shape of the ground electrode and is arranged to surround a periphery of the ground electrode,
   wherein a support spacer is located between edge portions of the lower electrode layer and the upper electrode layer to form a gap between the lower electrode layer and the upper electrode layer,
   wherein a support layer is disposed between the substrate and the lower electrode layer and a central spacer is located between the substrate and the support layer, and
   wherein a top surface of the central spacer is in contact with the support layer such that a central portion of the lower electrode layer is bent upward while a bottom surface of the central spacer is supported by the substrate.

2. The haptic feedback button of claim 1, wherein each of the upper electrode layer, the cover, and the support spacer is made of a transparent material.

3. The haptic feedback button of claim 1, wherein each of the cover and the upper electrode layer is made of a flexible material.

4. The haptic feedback button of claim 1, wherein at least a part of the cover is made of a stiff material.

5. The haptic feedback button of claim 4, wherein an edge portion of the cover and an edge portion of the upper electrode layer are bent upward.

6. The haptic feedback button of claim 4, wherein an edge portion of the upper electrode layer is bent upward.

7. The haptic feedback button of claim 4, wherein an edge portion of the cover has a hinge groove thereon such that a thickness of the edge portion of the cover is reduced.

8. The haptic feedback button of claim 4, wherein:
   the haptic feedback button is configured to select an elastic coefficient and a thickness of the support layer to generate a resonance in a frequency ranging from 100 to 250 Hz.

9. The haptic feedback button of claim 4, wherein the cover includes:
   a stiff portion made of a stiff material; and
   a flexible portion disposed on the stiff portion and made of a flexible material,
   wherein an edge portion of the stiff portion is incised.

10. The haptic feedback button of claim 9, wherein the incised edge portion of the stiff portion is filled with the flexible portion.

11. The haptic feedback button of claim 4, wherein the cover includes:
    a flexible portion made of a flexible material and disposed only on an edge portion of the cover; and
    a stiff portion disposed on the flexible portion and made of a stiff material.

12. The haptic feedback button of claim 1, wherein the piezoelectric polymer layer includes a polyvinylidene fluoride (PVDF)-based ferroelectric polymer or a relaxor ferroelectric polymer.

13. The haptic feedback button of claim 12, wherein:
    the PVDF-based ferroelectric polymer includes P(VDF-TrFE); and
    the relaxor ferroelectric polymer includes P(VDF-TrFE-CFE) or P(VDF-TrFE-CTFE).

14. A haptic feedback button, comprising:
    a substrate;
    a lower electrode layer disposed on or above the substrate and having a ground electrode and a touch sensing electrode arranged in a pattern;
    an upper electrode layer disposed above the lower electrode layer and spaced apart from the lower electrode layer, wherein the upper electrode layer is configured to receive a driving voltage;
    a cover disposed on the upper electrode layer; and a piezoelectric polymer layer disposed on a top surface of the lower electrode layer or on a bottom surface of the upper electrode layer facing the top surface of the lower electrode layer, wherein the piezoelectric polymer layer is configured to generate a fretting vibration when the piezoelectric polymer layer is pressed against the upper electrode layer or the lower electrode layer, and wherein the ground electrode has a clover shape and is disposed at a center of the lower electrode, wherein the touch sensing electrode has a ring shape having an inner clover-shaped space corresponding to the clover shape of the ground electrode and is arranged to surround a periphery of the ground electrode, wherein a support spacer is located between edge portions of the lower electrode layer and the upper electrode layer to form a gap between the lower electrode layer and the upper electrode layer, wherein a support layer is disposed between the substrate and the lower electrode layer and a central spacer is located between the substrate and the support layer, and wherein a top surface of the central spacer is in contact with the support layer such that a central portion of the lower electrode layer is bent upward while a bottom surface of the central spacer is supported by the substrate.

* * * * *